United States Patent
Kidd et al.

(10) Patent No.: US 9,772,368 B2
(45) Date of Patent: Sep. 26, 2017

(54) DETECTION OF AN ABNORMAL SIGNAL IN A COMPOUND SAMPLED SIGNAL

(71) Applicant: Bosch Automotive Service Solutions Inc., Warren, MI (US)

(72) Inventors: Moray Kidd, Derbyshire (GB); Zhanqun Shi, Huddersfield (GB)

(73) Assignee: Bosch Automotive Service Solutions Inc., Warren, MI (US)

( * ) Notice: Subject to any disclaimer, the term of this patent is extended or adjusted under 35 U.S.C. 154(b) by 691 days.

(21) Appl. No.: 13/693,849

(22) Filed: Dec. 4, 2012

(65) Prior Publication Data

US 2013/0096855 A1 Apr. 18, 2013

Related U.S. Application Data

(63) Continuation of application No. 12/615,643, filed on Nov. 10, 2009, now Pat. No. 8,326,557, which is a (Continued)

(30) Foreign Application Priority Data

May 11, 2007 (GB) .................... 0709044.2

(51) Int. Cl.
  *G01R 31/08* (2006.01)
  *G01H 3/08* (2006.01)
  *G06F 15/00* (2006.01)
(52) U.S. Cl.
  CPC ............ *G01R 31/08* (2013.01); *G01H 3/08* (2013.01); *G06F 15/00* (2013.01)
(58) Field of Classification Search
  CPC .................................................. G01R 31/08
  See application file for complete search history.

(56) References Cited

U.S. PATENT DOCUMENTS 6,873,921 B1   3/2005   Tucker
6,954,420 B1*  10/2005  Wolf et al. ................. 370/203
(Continued)

FOREIGN PATENT DOCUMENTS

EP   1462777 A1   9/2004
JP   200479316 A  10/2004

OTHER PUBLICATIONS

Ogi et al.—"Fault Diagnosis System for GIS Using an Artificial Neutral Network". Neural Networks to Power Systems, 1991. Proceedings of the First International Forum on Applications of Seattle, WA, USA, Jul. 23-26, 1991. New York, NY, USA IEEE, US Jul. 23, 1991, pp. 112-116.

*Primary Examiner* — Manuel Rivera Vargas
(74) *Attorney, Agent, or Firm* — Baker Hostetler LLP

(57) ABSTRACT

A technique detects an abnormal signal in a compound sampled signal recorded in the time domain. The technique involves dividing the sampled signal recorded in the time domain into sample segments; transforming each of the sample segments from the time domain into the frequency domain to determine transformed segments, each transformed segment having frequency points, each frequency point having an amplitude associated with a certain frequency; for a frequency point in a given transformed segment, determining a ratio by dividing the amplitude of the frequency point by a value indicative of an average of the amplitudes of the frequency points at the same frequency across transformed segments; repeating the determination of a ratio for frequency points in each transformed segment to determine ratios for each transformed segment; repeating the determination of ratios for transformed segments; and using the ratios to detect the abnormal signal in the compound sampled signal.

20 Claims, 7 Drawing Sheets

Related U.S. Application Data continuation of application No. PCT/GB2008/001249, filed on Apr. 10, 2008.

(56) References Cited

U.S. PATENT DOCUMENTS

| | | |
|---|---|---|
| 7,133,529 B2 | 11/2006 | Ura |
| 7,668,711 B2 | 2/2010 | Chong et al. |
| 2004/0230387 A1* | 11/2004 | Bechhoefer .................... 702/58 |
| 2005/0228649 A1 | 10/2005 | Harb et al. |

* cited by examiner

DETECTION OF AN ABNORMAL SIGNAL IN A COMPOUND SAMPLED SIGNAL

CROSS REFERENCE TO RELATED APPLICATIONS

This application is a Continuation of U.S. patent application Ser. No. 12/615,643 filed Nov. 10, 2009 which is a Continuation of PCT/GB2008/001249, filed Apr. 10, 2008 which claims priority to foreign Patent Application GB 0709044.2, filed on May 11, 2007, the contents of which are incorporated herein by reference in their entireties.

FIELD OF THE INVENTION

The present invention relates to signal detection, and in particular to the detection of an abnormal signal in a compound signal.

BACKGROUND

It is often necessary or desirable to detect a signal in a compound signal. For example, most motorists have detected an annoying sound in the cabin of their car while driving the car around. In order to identify the annoying sound (i.e. the signal) from background noise caused by the car engine and road noise, etc (i.e. the compound signal) one of a number of different techniques are used. In one technique, a trained technician may, sit in the car whilst it is in motion and use his trained ear to identify the annoying sound and its cause. The cause of the annoying sound may be, for example, due to a clutch clicking or a seat squeaking. A technician can identify the source of the annoying sound and then rectify it. In another example, the sound in the cabin of the car may be recorded and processed mathematically. Changes in the recorded signal may be attributed to the annoying sound, and these changes can be detected using the mathematical processing. One way of processing the signal is to discretise it into a number of points (or, conversely, recording the signal in a discretised manner, for example by sampling the signal). The discretised recorded signal can be split into a number of segments. These segments can be characterised by determining, in each segment, the standard deviation of the segments divided by the mean value of recorded data within the segment (which is sometimes referred to as the determining the variation coefficient for the segment).

SUMMARY

Although the use of mathematical processing as described above is successful in some circumstances, it is not always sensitive enough to be used to detect some abnormal signals in a compound signal. One reason for this may be that the mathematical processing techniques used are not sensitive enough to small changes in the recorded signal.

In an alternative method, the environment which causes the compound signal to be generated can be modelled. By establishing a model of the environment, it is possible to see how changes to the model results in changes to the compound signal generated. Conversely, it is possible to determine what changes in the model lead to the generation of certain signals. Faults can be modelled, and signals generated by the model can be compared with real world signals to determiner their origins. However, in many real world situations the environment is too complicated to model accurately, or to model with any expectation of reliable results.

It is therefore an object of the present invention to obviate or mitigate at least one of the problems of the prior art, whether identified herein or elsewhere.

According to a first aspect of the present invention, there is provided a method of detecting an abnormal signal in a compound sampled signal recorded in the time domain, the method comprising: dividing the sampled signal recorded in the time domain into a plurality of sample segments; transforming each of the plurality of the sample segments from the time domain into the frequency domain to determine a plurality of transformed sample segments, each transformed sample segment having a plurality of frequency points, each frequency point having an amplitude associated with a certain frequency; for a frequency point in a given transformed sample segment, determining a ratio by dividing the amplitude of the frequency point by a value indicative of an average of the amplitudes of the frequency points at the same frequency across a plurality of transformed sample segments; repeating the determination of a ratio for a plurality of frequency points in each transformed sample segment to determine a plurality of ratios for each transformed sample segment; repeating the determination of a plurality of ratios for a plurality of transformed sample segments; and using the ratios to detect the abnormal signal in the compound sampled signal.

Preferably, a ratio is determined for a majority of the frequency points of each transformed sample segment. Most preferably, a ratio is determined for all of the frequency points of each transformed sample segment.

Preferably, the determination of a plurality of ratios is undertaken for a majority of the transformed sample segments. Most preferably, the determination of a plurality of ratios is undertaken for all of the transformed sample segments.

Preferably, the value indicative of an average of the amplitudes of the frequency points at the same frequency across a plurality of transformed sample segments is determined across a majority of transformed sample segments. Most preferably, the value indicative of an average of the amplitudes of the frequency points at the same frequency across a plurality of transformed sample segments is determined across all of the transformed sample segments. Preferably, the value indicative of an average of the amplitudes of the frequency points at the same frequency across a plurality of transformed sample segments is indicative of the mean, median or mode value.

Preferably, the method further comprises adding the plurality of ratios together to determine a summed ratio for each transformed sample segment. Preferably, each ratio of the plurality is squared before they are added together to determine a summed squared ratio for each transformed sample segment.

Preferably, detecting the abnormal signal comprises identifying the sample segments having the highest summed ratios or summed squared ratios. Preferably, the summed ratios or summed squared ratios are deemed to be the highest if they exceed a predetermined threshold. Preferably, the threshold is a percentage of a peak summed ratio or summed squared ratio. The threshold maybe 60% of the peak summed ratio summed squared ratio.

The method may further comprise taking away from the frequency points of a transformed sample segment deemed to have a highest summed ratio or summed squared ratio the frequency points of a transformed sample segment deemed not to have a highest summed ratio or summed squared ratio.

Preferably, a location of transformed sample segments in the frequency domain having the highest summed ratios or summed squared ratios is used to identify the corresponding sample segments in the time domain. Alternatively, the transformed sample segment or segments having the highest summed ratios or summed squared ratios are transformed from the frequency domain into the time domain. Preferably, the sample segment in the time domain is analysed to determine if the sample segment in the time domain contains some or all of the abnormal signal. The analysis may comprise playing the signal back to a human. Alternatively the method may comprise using detection hardware or software to compare the sample segments in the time domain with a plurality of stored signals.

According to a second aspect of the present invention, there is provided a computer readable medium carrying computer readable instructions configured to cause a computer to carry out a method according to any preceding claim.

According to a third aspect of the present invention, there is provided a computer apparatus for detecting an abnormal signal in a compound sampled signal, comprising: a memory storing processor readable instructions; and a processor for reading and executing instructions stored in the memory; wherein the processor readable instructions comprise instructions configured to cause the processor to carry out the method of any preceding claim.

BRIEF DESCRIPTION OF THE DRAWINGS

Embodiments of the present invention will now be described, by way of example only, with reference to the accompanying Figures, in which.

DETAILED DESCRIPTION

Figure 1:
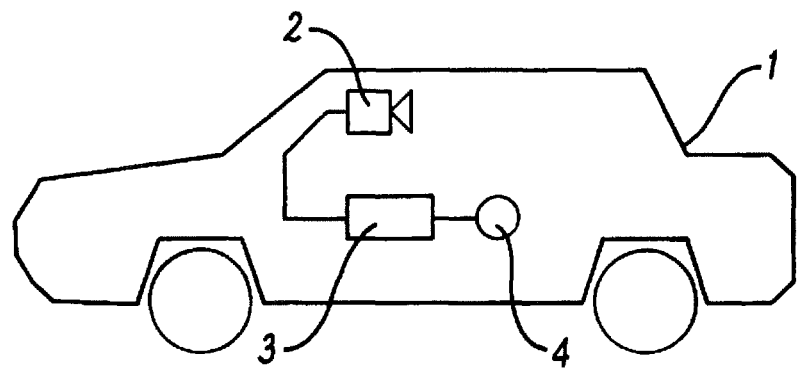
FIG. 1 depicts an application of the present invention.

FIG. 1 depicts an outline of a car 1. Located within the car 1 is a microphone 2 for detecting acoustic signals within the car 1. The microphone 2 is connected to a recorder 3 for recording acoustic signals detected by the microphone 2. The recorder 3 is provided with an output 4 to allow data from the recorder 3 to be output to other apparatus, for example a computer or the like.

In use, the microphone 2 continuously detects acoustic signals within the car 1. These acoustic signals are recorded continuously by the recorder 3. A person (not shown) within the car 1 may hear a sound which they associate with a fault. For example, the person may hear a repetitious knocking sound or clicking sound indicative of a fault with a part of the car. Once such a sound is heard the person may provide an input to the recorder 2, for example by pressing a button (not shown). When the button is pressed the recorder may automatically store, for example, the last 20 seconds worth of recorded signals. The stored recording may then be processed at a later stage to identify the cause of the sound which the person attributed to a fault in the car 1. Such a button on the recorder 3 may be pressed any number of times to store any number of recorded signals for appropriate processing at a later stage. The stored recorded signals may be accessed via the output 4.

In accordance with an embodiment of the present invention, the recorder 3 records signals detected by the microphone 2 in a discrete manner. Specifically, the recorder 3 samples the acoustic signals within the car 1 at a predetermined frequency. The sampling frequency may be any suitable frequency. If the acoustic signal attributable to the fault is audible then it is within the range of human hearing, that is within the range of 20 Hz to 20 kHz. An industry standard sampling rate of 44.1 kHz will therefore be suitable for capture acoustic signals in the range of 20 Hz to 20 kHz.

Figure 2A:
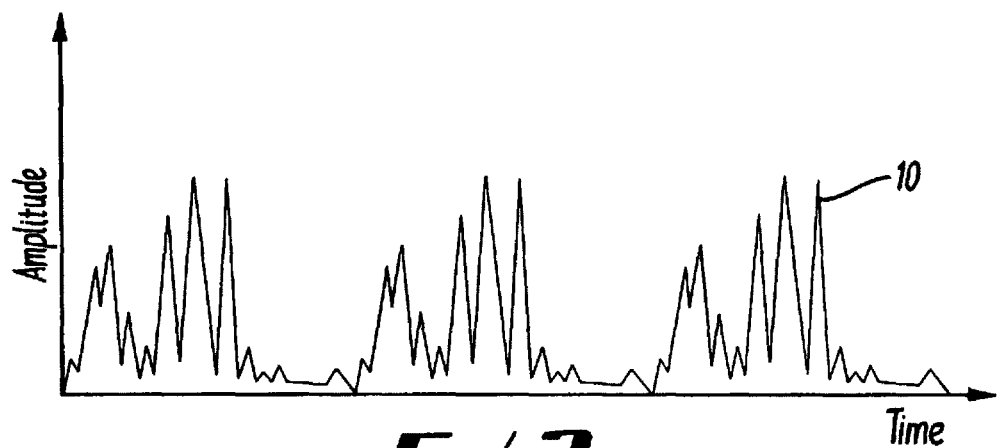
FIGS. 2a and 2b depict operating principles of an embodiment of the present invention.

FIG. 2a illustrates a stored recorded acoustic signal 10 (hereinafter referred to as 'the stored signal 10'). The stored signal 10 is a compound signal. For example, the stored signal 10 may comprise a mixture of road noise, engine noise, as well as the acoustic signal attributed to a fault within the car.

Figure 2B:
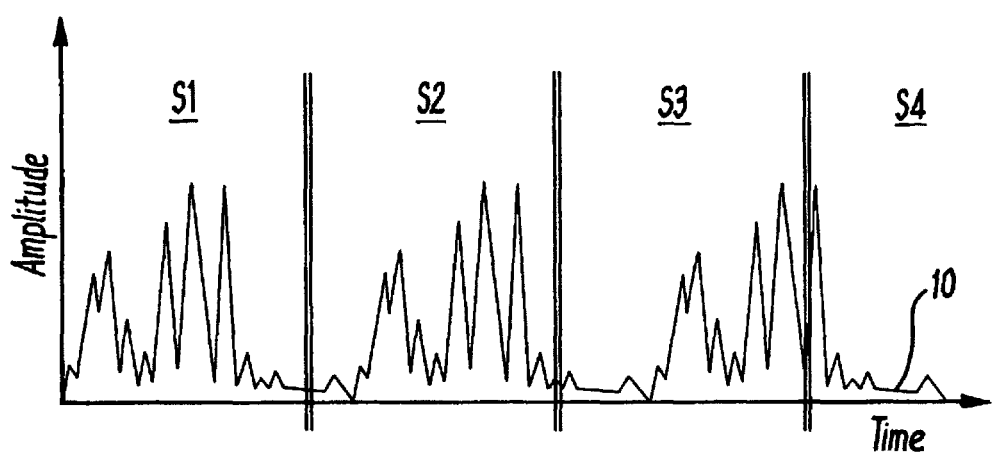

FIG. 2b shows that, in order to assist the detection and identification of the acoustic fault signal, the stored signal 10 is segmented into a number of segments S1, S2, S3, S4 and so on. As mentioned above the sampling rate is 44.1 kHz. If each segment contains 8192 samples (e.g. data points) the frequency resolution will be 5.38 Hz (44100 Hz/8192=5.38 Hz). 15 seconds' worth of the recorded signal contains 80 whole segments. Further processing of the signal is usually undertaken on a central selection of the segments. This is to ensure that the earlier and later segments have not been contaminated by for example the person in the car moving to actuate the recorder. Thus, for example, the central 64 segments of the stored signal 10 may be taken.

Figure 3A:
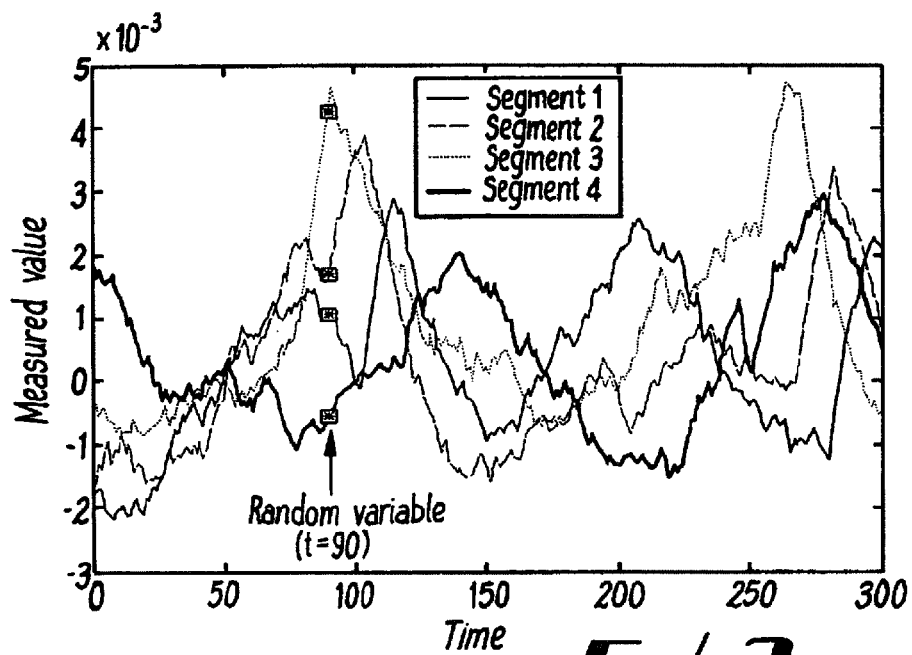
FIGS. 3a and 3b depict a comparison between signals in the time domain and frequency domain respectively.
Figure 3B:
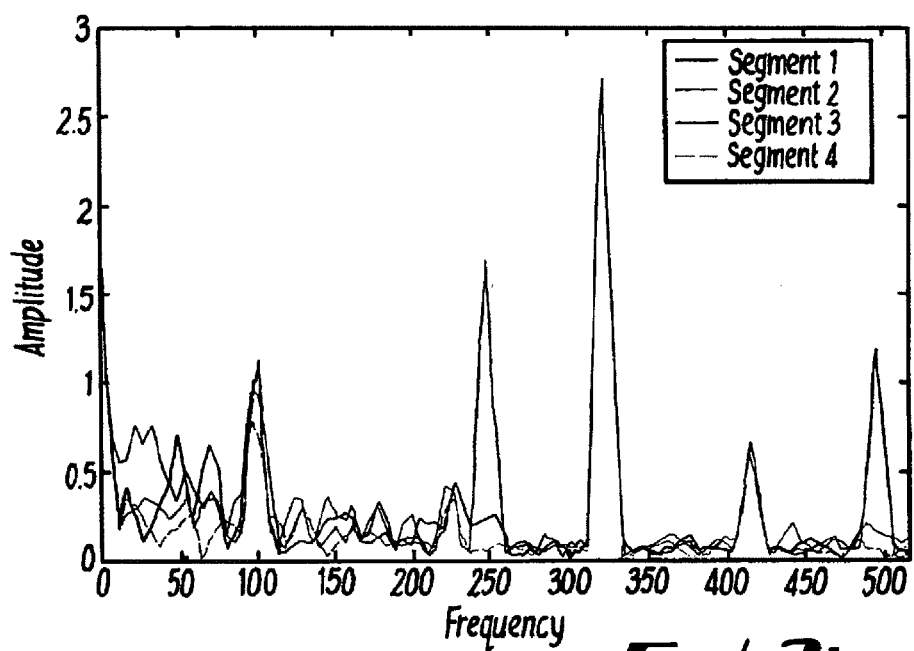

As is known in signal processing, a signal can be processed in the time domain or the frequency domain. FIG. 3a shows a number of overlaid segments S1, S2, S3, S4. It can be seen that a certain time (for example t=90), the value recorded is vastly differently for the different segments. This is because, in the time domain, the comparison between the values of different segments is very phase sensitive. This is because there is no particular way of accurately determining when, for example, the fault signal started and stopped, and thus segmenting the recorded signal to take the location of the fault signal into account. Instead, arbitrary start and end points for the recorded signal are taken, meaning that the segments created by the division of the recorded signal divide the recorded signal arbitrarily. In short, the result is that the segments are out of phase with one another. FIG. 3b shows the situation when the data in the segments is transformed from the time domain into the frequency domain. It can be seen that the phase sensitivity is removed such that the data within the segments can be directly compared. Thus, it is preferable to undertake further processing of the segments in the frequency domain.

Each of the segments is now transformed from the time domain to the frequency domain. The transformation may be undertaken using, for example, well known Fast Fourier Transform techniques. Each transformed segment then contains a number of frequency points which represent the amplitude (i.e. value) of the recorded signal at specific frequencies (in the frequency domain). Next, for each frequency point in the segment, the value at the frequency point is divided by the mean of the values at the same frequency in all the segments. This process is undertaken for all frequency points within the segments. This results in a ratio for each frequency point in the segment (i.e. the frequency point's value divided by the mean value for the same frequency across all the segments). The ratio gives an indication of the deviation of the value at the frequency point from the mean value, and is thus referred to as a deviation ratio. Deviation of one or more points from the mean is caused by an increase in the frequency components for that point, which may be attributable to a fault in the car.

The deviation ratios for each frequency point within a given segment are then summed together. The total of the ratios for each segment can then be compared to determine which segment contains frequency points that have deviated the most from their mean across the segments. For example, the higher the sum of the deviation ratios for the segments, the more likely it is that something other than constant background noise (e.g. engine and road noise) caused the deviation. This conclusion can be used to detect the fault signal.

Instead of simply summing the ratios for each segment, each of the ratios may be squared before being added together. Such squaring determines an energy associated with each segment. Since the energy is associated with the summation of deviation ratios, the energy is hereinafter referred to as the deviation energy. According to Parseval's theorem, the signal energy in the frequency domain is the same as the signal frequency in the time domain, which means that conclusions drawn form the energy in the frequency domain can be used to draw conclusions in the time domain.

As mentioned, the segments with the highest summation of deviation ratios (or deviation energy) may indicate that a fault signal has some or all of its components in that segment. As described, the segment transformed to the frequency domain corresponds to a segment in the time domain. Thus, if a segment in the frequency domain has been identified as possibly containing some or all of the fault signal, the corresponding segment in the time domain can be played back to the people within the car so that they can confirm that the sound is attributable to the fault within the car. The fault signal is thus extracted from a compound. In the frequency domain, the segment can be cleaned up by taking away from it the values of frequency points in a segment with little or no deviation from its mean (i.e. a constant background reference) to leave only the fault signal. The segment in the time domain or frequency domain can be compared with a library of known signals to identify any similarities between the recorded signal and known faults signals to determine the nature and/or origin of the fault signal.

It will be appreciated that there may be a number of segments which a high deviation ratio sum or deviation energy. Each of the segments having a high deviation ratio sum or deviation energy may hint at them containing some or all of a fault signal. Thus, a threshold may be imposed to help identify segments having deviation ratio sums or deviation energies above a certain level. This threshold may be derived from experience that comes with used of the method, from trial and error, from statistics etc. For example, all segments with deviation ratio sums or deviation energies higher than 60% of the peak value could be investigated further (where, statistically speaking, a vast majority of the peaks will be present). Each segment having a sum of deviation ratios or a deviation energy higher than the threshold can then be looked at in more detail.

It will be appreciated that the present invention contrasts starkly to prior art methods, where the standard deviation of the value of points within a given segment was divided by the mean value of points within that segment. In short, because the present invention considers the deviation about individual points within each segment, a more sensitive detection mechanism is created.

It will be appreciated that the word 'fault' is a subjective term. More objectively, what is being undertaken with the method according to the embodiment of the present invention is detection of an abnormal signal in a compound signal. The signal is usually different in some way to some or all of the signals in the compound signal (in other words, abnormal), thereby adding additional frequency components to the compound which can be identified and extracted as identified above. Practical examples of the use of the method according to the embodiment of the present invention are described in relation to FIGS. 4-8, although it will be appreciated that other applications of the method are also possible.

Figure 4:
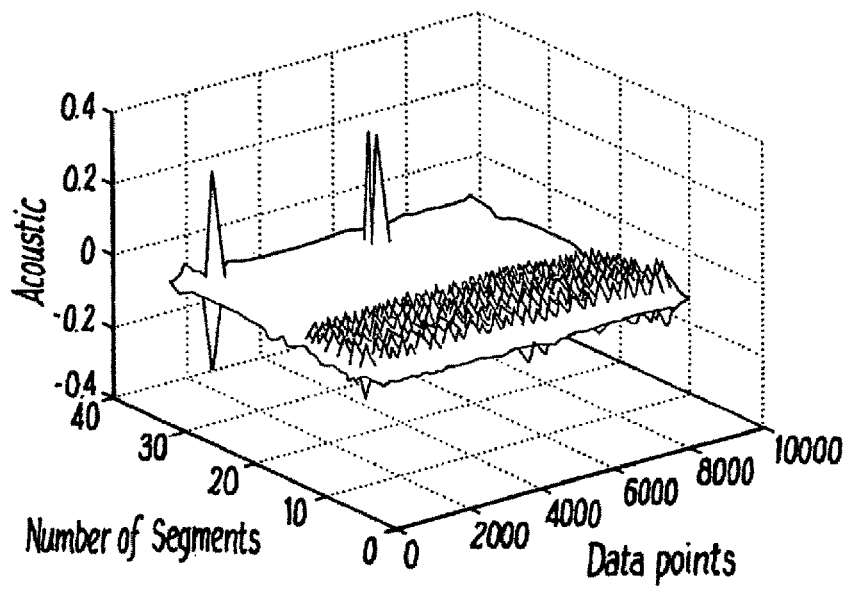
FIG. 4 is a graph representing a signal recorded over a period of time and then segmented.

A compound signal, comprising a mixture of acoustic signals in a car, is recorded and sampled over a period of time. The compound signal includes an acoustic signal from a clutch that is clicking (i.e. the fault signal). The recorded time signal is then divided into 32 segments, each segment comprising 8192 data points. FIG. 4 is a plot of these segments laid alongside one another. It can be seen that there are a number of peaks contained in segments 26 to 30. Thus, in the time domain the fault signal would appear to be in segments 26 to 30.

Figure 5A:
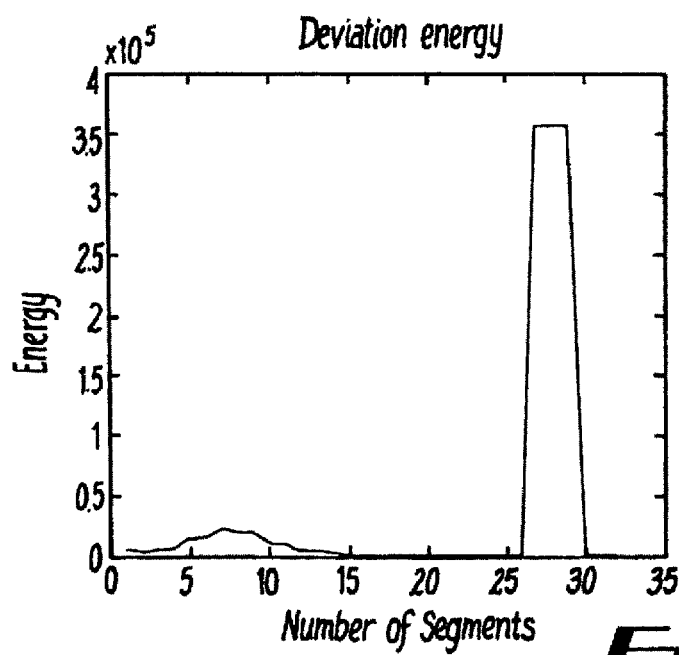
FIGS. 5a and 5b depict results obtainable using a method in accordance with an embodiment of the present invention.

Using the method described above, the deviation energy is calculated for each of the segments. FIG. 5a is a plot of the deviation energy for the segments. It can be seen that the deviation energy is particularly high for segments 26 to 30, which is in very good agreement with the acoustic peaks observed in the time domain segments of FIG. 4. This goes some way to proving the reliability of the use of deviation ratios and deviation energies to determine abnormal (e.g. fault) signals in a compound signal.

As discussed above, the segments containing the highest deviation energy correspond to the same segments in the time domain. The segments in the time domain can be played back to the car driver, a technician or comparison software to determine if the segment contains the clutch click.

Figure 5B:
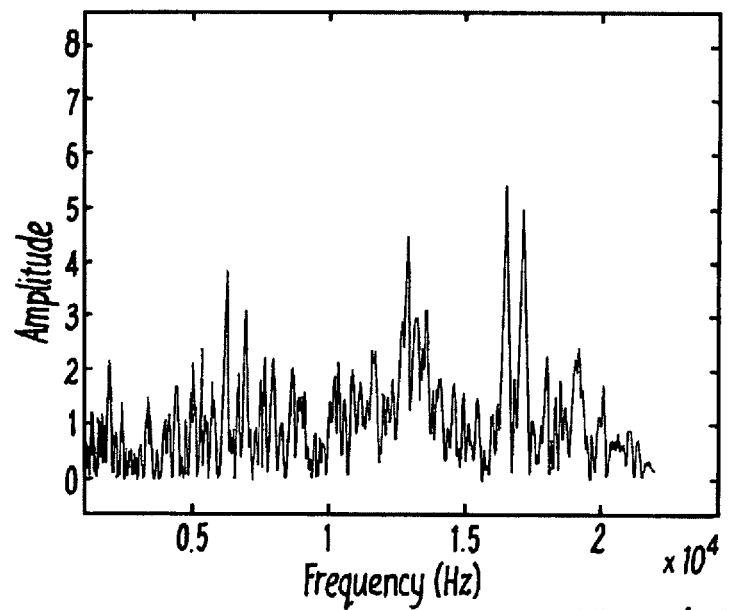
Figure 6:
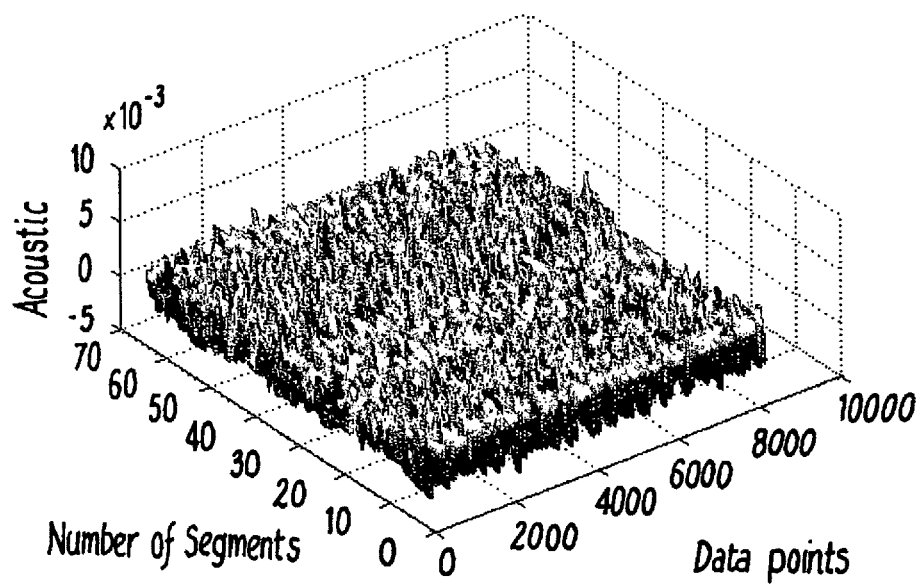
FIG. 6 depicts a plot of another signal recorded over a period of time and then segmented.

FIG. 5b shows the segment having the highest deviation energy transformed into the frequency domain, from which more information about the fault signal can be obtained.

Figure 7A:
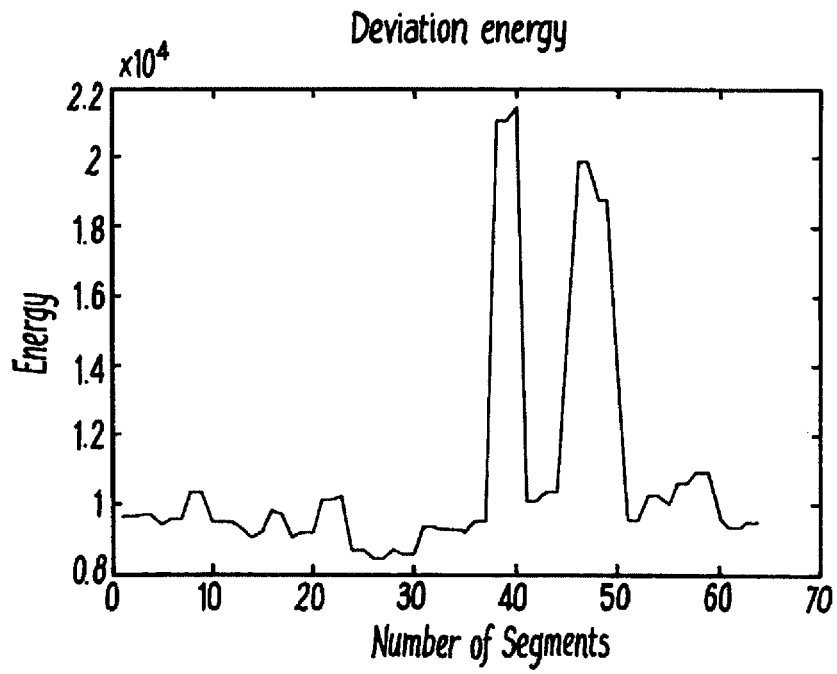
FIGS. 7a to 7g depict results obtainable using a method in accordance with an embodiment of the present invention, together with comparisons with prior art methods.

In another example, another compound signal comprising a mixture of acoustic signals is recorded and sampled in a car with a squeaking seat. The recorded signal is divided into 64 segments, each segment containing 8192 data points. These segments are shown alongside each other in the graph of FIG. 6. It can be seen that at first glance it is not that easy to determine the maximum peak in the time domain, since there is very little difference in the recorded acoustic signals between the different segments. Nevertheless, the maximum peak in the time domain can be found in segment 51 and segment 52. Using the variation coefficient method mentioned in the introduction above, the highest variation coefficients are present in segments 38 and 39. In contrast, using the method according to an embodiment of the present invention, the deviation energy of the segments is highest in segments 38, 39, 40, and 45, 46, 47, 48, 49, 50, as shown in FIG. 7a. The segments identified as potentially containing faults using the time domain method are not present in the segments identified as potentially containing faults using the method according to an embodiment of the present invention. It is therefore clear that one or both methods have not correctly identified the segments in which some or all of the fault signal is present. In order to identify which, if any, of the methods used to identify the segments containing fault signals are correct, further investigation needs to be undertaken.

Figure 7B:
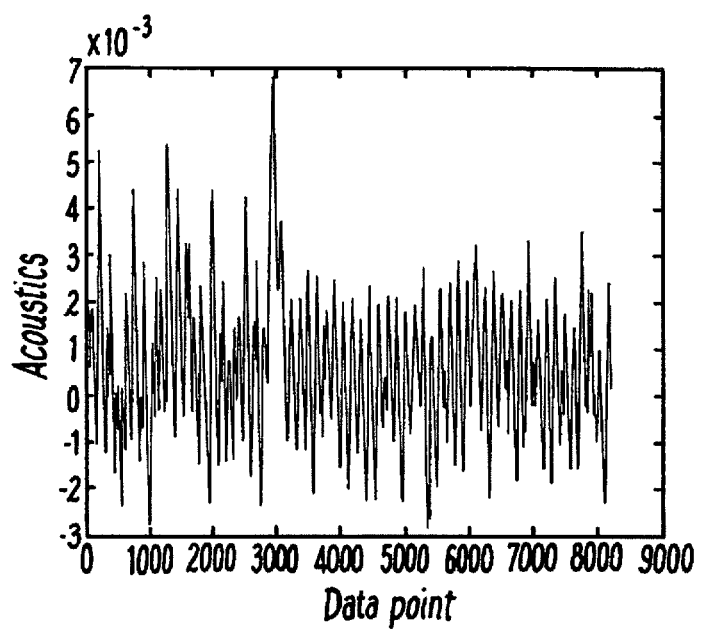
Figure 7C:
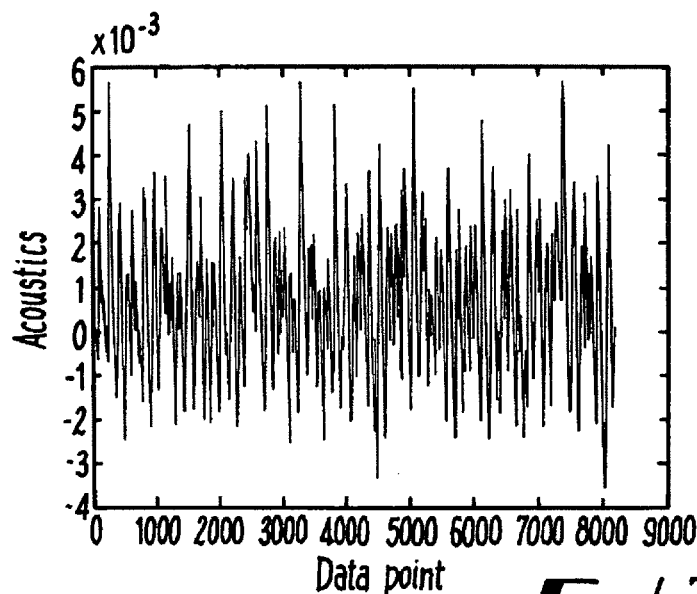

FIG. 7b is a graph depicting segment 51 in the time domain, and which the time domain method identified as a segment containing at least a part of a fault signal. FIG. 7c shows segment 39 in the time domain, and which the method according to an embodiment of the present invention identified as comprising all or some of a fault signal. At first glance, the graphs of FIGS. 7b and 7c look fairly similar. It is only when these graphs are transformed into the frequency domain do the differences become more apparent.

Figure 7D:
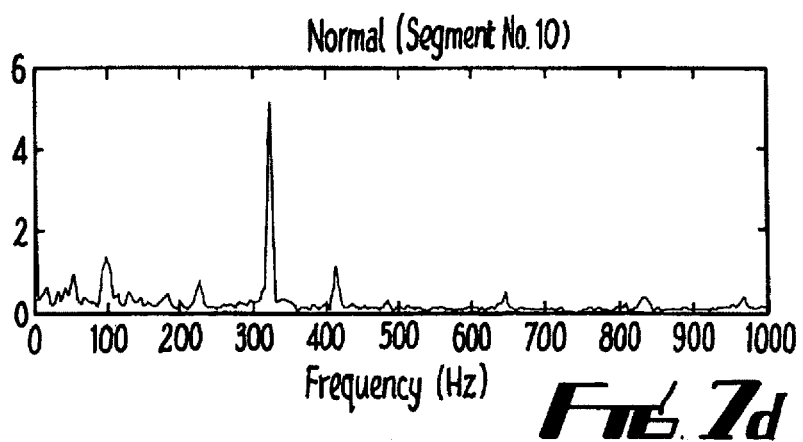
Figure 7E:
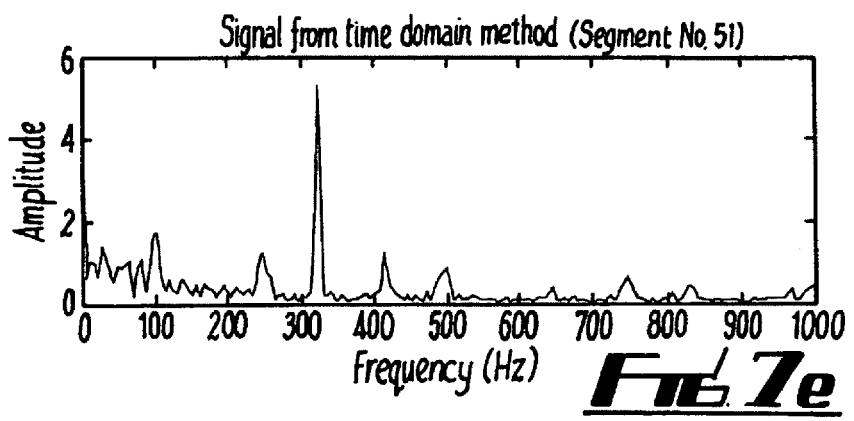
Figure 7F:
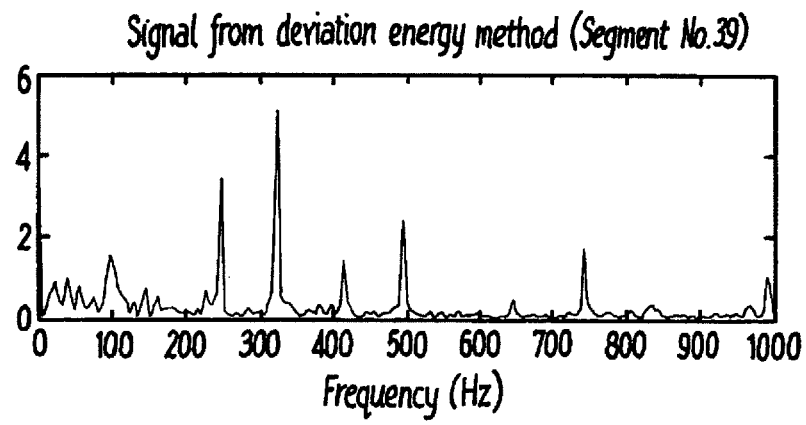

FIG. 7d is a graph of segment 10 in the frequency domain. Segment 10 has been chosen since none of the methods used identify the segment as containing a fault signal. This segment can therefore be used as a zero level, or background against which the other segments can be judged. FIG. 7e is a graph of segment 51 transformed into the frequency domain. FIG. 7f is a graph of segment 39 transformed into the frequency domain. It can be seen that FIGS. 7d and 7e are very similar, in that the frequency components of segment 10 (i.e. the normal segment) are very similar to the frequency components of segment 51 (i.e. the segment which the time domain method identified as containing a fault signal). It can be concluded that the time domain method has incorrectly identified segment 51 as containing some or all of a fault signal. On the other hand, the graph of FIG. 7f is quite different to both the graph of FIG. 7d and of 7e, and therefore indicates that segment 39 is not normal, but contains some or all of an abnormal signal, i.e. the fault signal.

The deviation energy method identified more segments in which faults or fault components may reside than any another prior art method, for example the time domain method or the variation coefficient method. This shows that the deviation energy method is a more sensitive method than those of the prior art, and that it can potentially be used to more easily detect and identify fault signals in a compound signal.

Figure 7G:
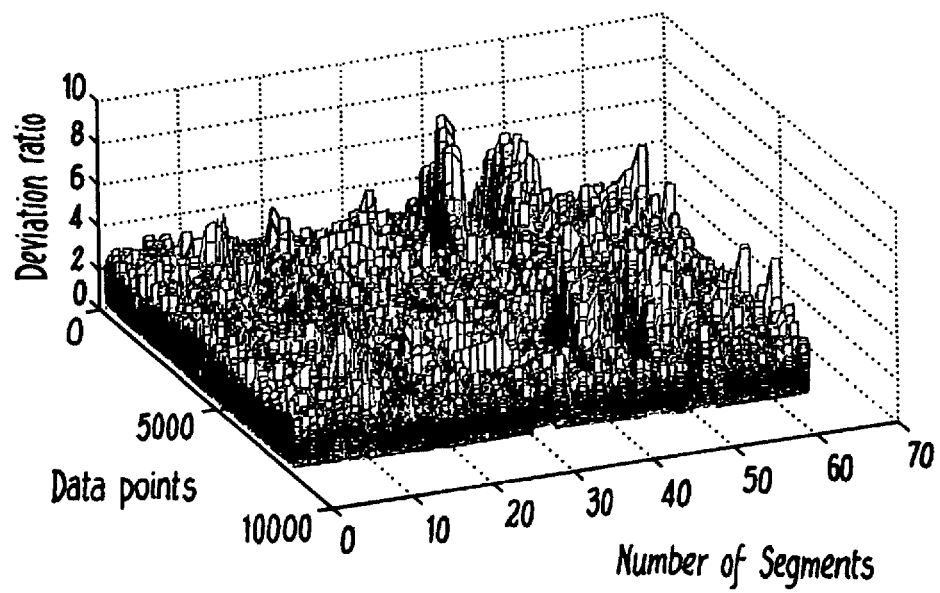

FIG. 7g illustrates the deviation ratios for all points in all of the segments. As expected, the deviation ratios are highest in segments where the deviation energies were calculated to be the highest. That is, the deviation ratios are highest in segments 38, 39, 40 and 45, 46, 47, 48, 49 and 50.

FIG. 7g illustrates how it is not essential to establish the deviation energy for each segment to determine if some or all of a fault signal is present in that segment. It can readily be seen that the determination of the deviation ratio alone can yield this information, however crudely. The number of deviation ratios above a certain threshold could be used to identify a segment potentially containing some or all of a fault signal. The deviation ratios may be used in any other number of ways to determine if a segment contains some or all of a fault signal.

In the embodiments described above, the sampling frequency is described as being 44.1 kHz. This is not essential, and any sampling frequency may be used which adequately samples the compound signal. 44.1 kHz is suitable for acoustic signals, since it covers the range of human hearing (i.e. 20 Hz to 20 kHz). For other applications, where the frequency range of interest, or change in frequency, is higher or lower than 20 Hz to 20 kHz, a higher or lower sampling rate may be preferable.

As mentioned above, the sampled recording was divided up into segments which contained enough data points to obtain a frequency resolution of 5.38 Hz. It will be appreciated that the number of data points within a segment, the sampling rate and the ultimate frequency resolution are all interrelated, and may be varied accordingly to achieve any desired resolution. A resolution of 5.38 Hz is by no means essential. It will also be appreciated that the smaller the segments, the more transforms that need to be undertaken from the time domain to the frequency domain. The fewer segments there are, the larger the segments are which need to be transformed into the frequency domain. Whatever the choice, there will be associated processing implications (e.g. computer processing time), and it may well be that these processing implications play a significant parts in determining the size of the segments.

In the embodiments described above, for each frequency point in the segment, the value (i.e. amplitude) at the frequency point is divided by the mean of the values at all of the frequency points having the same frequency across all the segments. Use of the mean value is not essential. Any value indicative of an average of the values at all of the frequency points having the same frequency across all the segments may be used, for example the mode or median value. Similarly, it is not essential that the deviation ratio is established for all or the majority of frequency points in a segment, although some resolution and frequency components information will be lost if this is not done. It is not essential the value indicative of an average value of a given frequency is derived from all or the majority of the segments, although some information may be lost if this is not done.

The embodiments above have been described in relation to cars, car cabins and car faults. It will be appreciated that the invention is not so limited. The invention is applicable to any situation where it is desired to detect an abnormal signal in a compound. For example, the method of the present invention could be used to detect a fault signal with a machine by monitoring its vibration using pressure sensors or microphones or the like. The method of the present invention could be used to detect a fault signal in an electrocardiogram, for example an irregular heartbeat interposed with a regular heartbeat, by direct monitoring and processing of the detected heart beat. It will be appreciated that the method of the present invention may be used in a wide range of applications. The signal, and/or compound signal, may be any form of signal, and may be, or be generated by, or comprise for example: a pressure wave, a vibration of an object, an electrical signal, a magnetic signal, a capacitive signal, or an electromagnetic wave.

Any suitable computer apparatus can be configured to carry out the methods described above. For example, a standalone computer with appropriate software could be used or a purpose built machine.

It will be appreciated that the above embodiments have been described by way of example only. Various modifications may be made to these and other embodiments without departing from the invention, which is defined by the claims that follow.

What is claimed is:

1. A computer-implemented method of detecting an origin of a fault signal caused by a fault in a vehicle, comprising:
   receiving, via a recorder, a compound sampled signal recorded in a time domain, wherein the compound signal includes the fault signal;
   identifying, via a computer processor, the fault signal in the compound sampled signal, wherein the fault signal is identified based at least in part on a deviation ratio of an amplitude of a frequency point of the compound sampled signal in a frequency domain with a mean value of amplitude of all frequency points of the compound sampled signal in the frequency domain, wherein the frequency domain corresponds to a segment in the time domain;

playing the corresponding segment of the time domain that corresponds to a segment of the frequency domain having the identified fault signal to a user or a driver who confirms the identified fault signal is attributable to the fault in the vehicle;

extracting the confirmed identified fault signal from the compound sampled signal with the processor by removing frequency points with little or no deviation from the mean value;

comparing, via the computer processor, the confirmed fault signal with a library of predetermined fault signals; and determining, via the computer processor, an origin of the fault signal.

2. The computer-implemented method of claim 1, wherein identifying the fault signal in the compound sampled signal comprises:

dividing the compound sampled signal recorded in the time domain into a plurality of sample segments; and transforming each of the plurality of sample segments from the time domain into the frequency domain to determine a plurality of transformed sample segments, wherein each of the plurality of transformed sample segments include a plurality of frequency points.

3. The computer-implemented method of claim 2, wherein the amplitude of each of the plurality of frequency points of the plurality of transformed sample segments is associated with a certain frequency.

4. The computer-implemented method of claim 3, wherein the deviation ratio is determined by dividing the amplitude of the frequency point by the mean value of the amplitudes of the plurality of frequency points at same frequency across the plurality of transformed sample segments.

5. The computer-implemented method of claim 4, wherein a determination of the deviation ratio is repeated for the plurality of frequency points in each of the plurality of transformed sample segments to determine a plurality of deviation ratios for each of the plurality of frequency points and repeating the determination of the deviation ratio for the plurality of frequency points for the plurality of transformed sample segments.

6. The computer-implemented method of claim 5, wherein the mean value of the amplitudes of the plurality of frequency points at the same frequency across the plurality of transformed sample segments is determined across a majority of the plurality of transformed sample segments.

7. The computer-implemented method of claim 5, wherein the mean value of the amplitudes of the plurality of frequency points at the same frequency across the plurality of transformed sample segments is determined across all of the plurality of transformed sample segments.

8. The computer-implemented method of claim 5, wherein the mean value of the amplitudes of the plurality of frequency points at the same frequency across the plurality of transformed sample segments is indicative of a mode value.

9. The computer-implemented method of claim 5, further comprising adding the plurality of deviation ratios together to determine a summed ratio for each of the plurality of transformed sample segments.

10. The computer-implemented method of claim 9, wherein each deviation ratio of the plurality of deviation ratios is squared before each deviation ratio is added together to determine a summed squared ratio for each of the plurality of transformed sample segments.

11. The computer-implemented method of claim 10, further comprising identifying sample segments having highest summed ratios or summed squared ratios.

12. The computer-implemented method of claim 11, wherein the highest summed ratios or the summed squared ratios are deemed to be highest if they exceed a predetermined threshold.

13. The computer-implemented method of claim 12, wherein the predetermined threshold is a percentage of a peak summed ratio or summed squared ratio.

14. The computer-implemented method of claim 11, further comprising taking away from the plurality of frequency points of a transformed sample segment deemed to have a highest summed ratio or summed squared ratio the plurality of frequency points of a transformed sample segment deemed not to have the highest summed ratio or summed squared ratio.

15. The computer-implemented method of claim 11, wherein a transformed sample segment or segments having the highest summed ratios or summed squared ratios are transformed from the frequency domain into the time domain.

16. The computer-implemented method of claim 11, wherein a location of the plurality of transformed sample segments in the frequency domain having the highest summed ratios or summed squared ratios is used to identify corresponding sample segments in the time domain.

17. The computer-implemented method of claim 11, wherein the plurality of sample segments in the time domain is analyzed to determine if the plurality of sample segments in the time domain contain some or all of the fault signal.

18. The computer-implemented method of claim 17, wherein the analysis comprises using detection hardware or software to compare the plurality of sample segments in the time domain with a plurality of stored signals.

19. A non-transitory computer readable medium storing computer readable instructions configured to cause a computer to:

receive a compound sampled signal recorded in a time domain, wherein the compound sampled signal includes a fault signal caused by a fault in a vehicle;

identify the fault signal in the compound sampled signal, wherein the fault signal is identified based at least in part on a deviation ratio of an amplitude of a frequency point of the compound sampled signal in frequency domain with a mean value of amplitude of all frequency points of the compound sampled signal in the frequency domain;

play the corresponding segment of the time domain that corresponds to a segment of the frequency domain having the identified fault signal to a user or a driver who confirms the identified fault signal is attributable to the fault in the vehicle;

extract the confirmed identified fault signal from the compound sampled signal by removing frequency points with little or no deviation from the mean value;

compare the confirmed identified fault signal with a library of predetermined faults signals; and determine an origin of the fault signal.

20. A computer apparatus for detecting an origin of a fault signal, comprising:
a memory storing processor readable instructions; and
a processor that reads and executes the processor readable instructions stored in the memory;
wherein the processor readable instructions include instructions configured to cause the processor to:
receive a compound sampled signal recorded in a time domain, wherein the compound sampled signal includes the fault signal caused by a fault in a vehicle;
identify the fault signal in the compound sampled signal, wherein the fault signal is identified based at least in part on a deviation ratio of an amplitude of a frequency point of the compound sampled signal in a frequency domain with a mean value of amplitude of all frequency points of the compound sampled signal in the frequency domain;
play the corresponding segment of the time domain that corresponds to a segment of the frequency domain having the identified fault signal to a user or a driver who confirms the identified fault signal is attributable to the fault in the vehicle;
extract the confirmed identified fault signal from the compound sampled signal by removing frequency points with little or no deviation from the mean value;
compare the confirmed identified fault signal with a library of predetermined faults signals; and
determine an origin of the fault signal.

* * * * *